United States Patent
Cho et al.

(10) Patent No.: US 9,136,094 B2
(45) Date of Patent: Sep. 15, 2015

(54) METHOD OF PLASMA PROCESSING AND APPARATUSES USING THE METHOD

(71) Applicants: Jung Hyun Cho, Suwon-si (KR); Hyung Joon Kim, Suwon-si (KR); Sang Jean Jeon, Hwaseong-si (KR); Sang Heon Lee, Seongnam-si (KR); Jeong Yun Lee, Yongin-si (KR); Kyung Yub Jeon, Yongin-si (KR); Vasily Pashkovskiy, Suwon-si (KR)

(72) Inventors: Jung Hyun Cho, Suwon-si (KR); Hyung Joon Kim, Suwon-si (KR); Sang Jean Jeon, Hwaseong-si (KR); Sang Heon Lee, Seongnam-si (KR); Jeong Yun Lee, Yongin-si (KR); Kyung Yub Jeon, Yongin-si (KR); Vasily Pashkovskiy, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 14/021,335

(22) Filed: Sep. 9, 2013

(65) Prior Publication Data
US 2014/0193978 A1 Jul. 10, 2014

(30) Foreign Application Priority Data
Jan. 10, 2013 (KR) .................. 10-2013-0002807

(51) Int. Cl.
*H01J 37/32* (2006.01)
*H01L 21/3065* (2006.01)
*H01L 21/67* (2006.01)
*H05H 1/24* (2006.01)

(52) U.S. Cl.
CPC ......... *H01J 37/32183* (2013.01); *H01J 37/321* (2013.01); *H01J 37/32165* (2013.01); *H01L 21/3065* (2013.01); *H01L 21/67017* (2013.01); *H01L 21/67069* (2013.01); *H05H 1/24* (2013.01)

(58) Field of Classification Search
CPC .............. H01L 21/3065; H01L 21/67069; H01L 21/67017; H05H 1/24; H05H 1/30
See application file for complete search history.

(56) References Cited

U.S. PATENT DOCUMENTS

| | | | |
|---|---|---|---|
| 7,214,619 B2 * | 5/2007 | Brown et al. ................. | 438/681 |
| 7,811,941 B1 | 10/2010 | Becker et al. | |
| 8,169,148 B2 | 5/2012 | Jeon et al. | |
| 8,216,421 B2 | 7/2012 | Nishida et al. | |
| 8,264,154 B2 | 9/2012 | Banner et al. | |
| 2004/0255864 A1 | 12/2004 | Jeon et al. | |
| 2008/0017317 A1 | 1/2008 | Jeon et al. | |
| 2009/0284156 A1 * | 11/2009 | Banna et al. ............. | 315/111.21 |
| 2010/0130018 A1 * | 5/2010 | Tokashiki et al. ............. | 438/710 |
| 2010/0269980 A1 | 10/2010 | Nishimura et al. | |
| 2013/0008867 A1 * | 1/2013 | Tokashiki et al. ............... | 216/22 |

FOREIGN PATENT DOCUMENTS

| | | |
|---|---|---|
| KR | 2006-0114151 A | 11/2006 |
| KR | 10-0751535 B1 | 8/2007 |
| KR | 2008-0082222 A | 9/2008 |
| KR | 10-1137692 B1 | 4/2012 |

* cited by examiner

*Primary Examiner* — Duy Deo
(74) *Attorney, Agent, or Firm* — Harness, Dickey & Pierce, P.L.C.

(57) ABSTRACT

A method of operating a plasma processing device includes outputting a first RF power having a first frequency and a first duty ratio, and outputting a second RF power having a second frequency higher than the first frequency and a second duty ratio smaller than the first duty ratio. The outputting of the first RF power and the outputting of the second RF power are synchronized with each other.

18 Claims, 11 Drawing Sheets

METHOD OF PLASMA PROCESSING AND APPARATUSES USING THE METHOD

CROSS-REFERENCE TO RELATED APPLICATIONS

This application claims priority under 35 U.S.C. §119(a) from Korean Patent Application No. 10-2013-0002807 filed on Jan. 10, 2013, the disclosure of which is hereby incorporated by reference in its entirety.

BACKGROUND

Example embodiments of inventive concepts relate to a method of generating plasma, and more particularly to a plasma processing method which may stably generate plasma, and devices using the method.

The plasma may be divided into capacitively coupled plasma (CCP) and inductively coupled plasma (ICP). The CCP means plasma generated by supplying a radio frequency (RF) power used as an energy source to between parallel electrodes facing each other, and the ICP means plasma generated by supplying the RF power to a coil disposed outside a plasma chamber.

SUMMARY

An example embodiment is directed to a method of operating a plasma processing device, including outputting a first RF power having a first frequency and a first duty ratio, and outputting a second RF power having a second frequency higher than the first frequency and a second duty ratio smaller than the first duty ratio. The outputting of the first RF power and the outputting of the second RF are synchronized with each other.

The method further includes outputting a third RF power to a bias electrode inside a plasma chamber, and generating plasma inside the plasma chamber based on the first RF power, the second RF power and an energy output from the bias electrode.

According to an example embodiment, the method further includes supplying each of the first RF power and the second RF power to an antenna outside and above a plasma chamber through a different transmission line.

According to another example embodiment, the method further includes supplying the first RF power to an antenna outside and above a plasma chamber, and supplying the second RF power to at least one electrode outside and above the plasma chamber.

In outputting the first RF power, generating the first RF power and outputting the first RF power using a first RF power pass filter are included. In outputting the second RF power, generating the second RF power and outputting the second RF power using a second RF power pass filter are included.

An example embodiment of the present inventive concepts is directed to a plasma processing device, including a plasma chamber, an RF output circuit outside and above the plasma chamber, a first RF power generation circuit configured to output a first RF power having a first frequency and a first duty ratio to the RF output circuit, a second RF power generation circuit configured to output a second RF power having a second frequency higher than the first frequency and a second duty ratio smaller than the first duty ratio to the RF output circuit. The first RF power generation circuit and the second RF generation circuit are configured to output the first RF power and an output time of the second RF power, respectively, synchronously.

An example embodiment of the present inventive concepts is directed to a method of manufacturing a semiconductor device, including outputting a first RF power having a first frequency and a first duty ratio to an RF output circuit, outputting a second RF power having a second frequency higher than the first frequency and a second duty ratio smaller than the first duty ratio to the RF output circuit, outputting a third RF power to a bias electrode inside the plasma chamber, generating plasma inside the plasma chamber using an energy output from the RF output circuit and an energy output from the bias electrode, processing a wafer positioned on the bias electrode by using an ion energy generated by the plasma. The outputting of the first RF power and the outputting of the second RF power are synchronized with each other.

An example embodiment of the present inventive concepts is directed to a semiconductor package, including a die included in the wafer manufactured according to a method of manufacturing the semiconductor device.

An example embodiment of the present inventive concepts is directed to an RF power generation module, including a first RF power generation circuit configured to output a first RF power having a first frequency and a first duty ratio to an RF output circuit through a first transmission line, and a second RF power generation circuit configured to output a second RF power having a second frequency higher than the first frequency and a second duty ratio smaller than the first duty ratio to the RF output circuit through a second transmission line. The first RF power generation circuit and the second RF generation circuit are configured to output the first RF power and an output time of the second RF power, respectively, synchronously are synchronized with each other.

BRIEF DESCRIPTION OF THE DRAWINGS

These and/or other aspects and advantages of inventive concepts will become apparent and more readily appreciated from the following description of the embodiments, taken in conjunction with the accompanying drawings of which.

DETAILED DESCRIPTION EXAMPLE EMBODIMENTS

Figure 1:
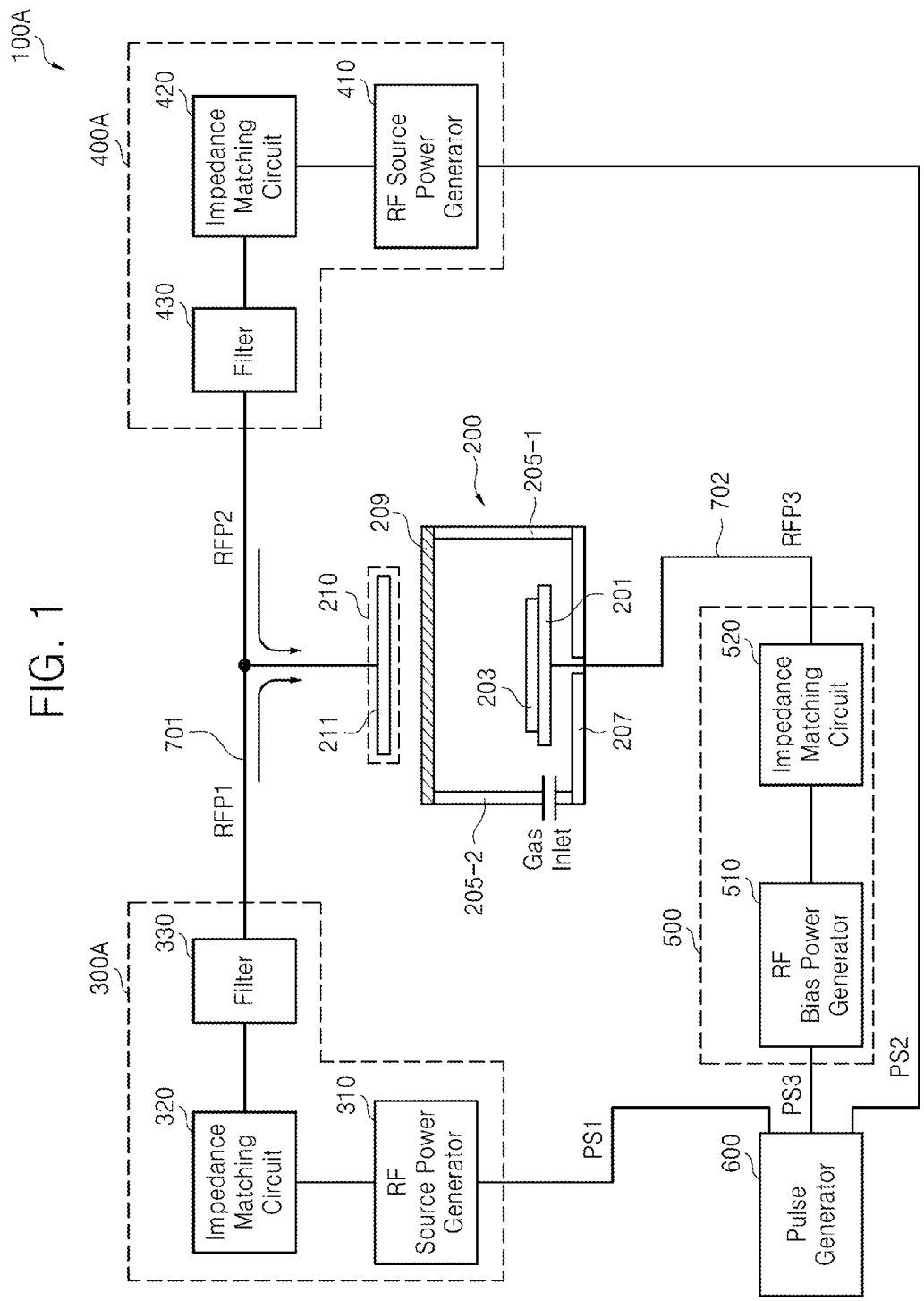
FIG. 1 is a block diagram of a plasma processing device according to an example embodiment of inventive concepts.

The present inventive concept now will be described more fully hereinafter with reference to the accompanying drawings, in which example embodiments are shown. Example embodiments may, however, be embodied in many different forms and should not be construed as limited to the embodiments set forth herein. Rather, these example embodiments are provided so that this disclosure will be thorough and complete, and will fully convey the scope of example embodiments to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a plasma processing device according to an example embodiment of inventive concepts.

Referring to FIG. 1, a plasma processing device 100A or a plasma device 100A includes a plasma chamber 200, a radio frequency (RF) output circuit 210, a first RF power generation circuit 300A, a second RF power generation circuit 400A, a third RF power generation circuit 500, a pulse generator 600, and transmission lines 701 and 702.

The plasma processing device 100A may generate inductively coupled plasma (ICP) by using an RF power or an RF signal.

The plasma chamber 200 may be embodied in a cylindrical shape. The plasma chamber 200 includes sealed side surface portions 205-1 and 205-2, a bottom surface portion 207, and a top surface portion 209. The side surface portions 205-1 and 205-2 and the bottom surface portion 207 may be embodied in metals, e.g., aluminum, and the top surface portion 209 may be embodied in a dielectric material, e.g., alumina $Al_2O_3$.

The RF output circuit 210 may be disposed outside and above the plasma chamber 200. The RF output circuit 210 may include a conductor which may output an RF power, e.g., an antenna 211 or an RF output coil 211.

The first RF power generation circuit 300A may output a first RF power RFP1 having a first frequency and a first duty ratio. For example, the first frequency may be 13.56 MHz.

The first RF power generation circuit 300A includes a first RF power generator 310 and a first impedance matching circuit 320. The first RF power generator 310 may be an RF source power generator.

The first RF power generator 310 generates a first RF power RFP1 in response to a first pulse signal PS1. The first impedance matching circuit 320 is used to match impedance of the first RF power generator 310 with impedance of the plasma chamber 200.

The second RF power generation circuit 400A may output a second RF power RFP2 having a second frequency higher than the first frequency and a second duty ratio smaller than the first duty ratio. For example, the first frequency may be 27.12 MHz to 100 MHz.

The second RF power generation circuit 400A includes a second RF power generator 410 and a second impedance matching circuit 420. The second RF power generator 410 may be an exciter.

The second RF power generator 310 generates a second RF power RFP2 in response to a second pulse signal PS2. The second impedance matching circuit 420 is used to match impedance of the second RF power generator 410 with impedance of the plasma chamber 200.

According to an example embodiment, the first RF power generation circuit 300A may further include a first filter 330, and the second RF power generation circuit 400A may further include a second filter 430.

Each of the first filter 330 and the second filter 430 may prevent the first RF power generation circuit 300A and the second RF power generation circuit 400A from affecting each other. That is, the first filter 330 may pass the first RF power RFP1 and block the second RF power RFP2. The second filter 430 may pass the second RF power RFP2 and block the first RF power RFP1.

In other words, the first filter 330 simultaneously performs both a function of the first RF power pass filter and a function of the second RF power blocking filter, and the second filter 430 simultaneously performs a function of the second RF power pass filter and a function of the first RF power blocking filter.

Figure 2:
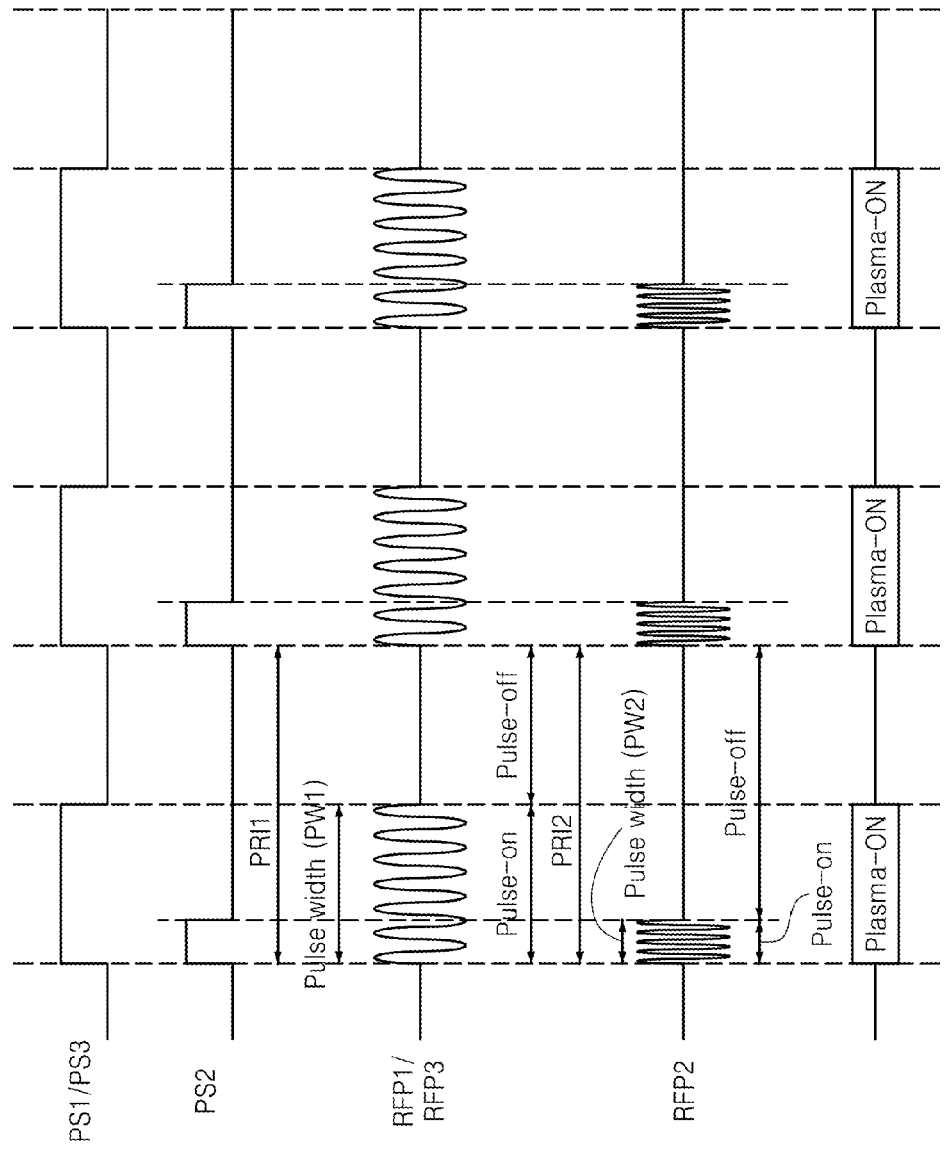
FIG. 2 is a waveform diagram of signals used in the plasma processing device of FIG. 1.

As illustrated in FIG. 2, a pulse repetition interval PRI1 of the first RF power RFP1 is equal to a pulse repetition interval PRI2 of the second RF power RFP2, and an output time (or timing) of the first RF power RFP1 and an output time (or timing) of the second RF power RFP2 are synchronized with each other.

The third RF power generation circuit 500 generates a third RF power RFP3 and supplies the third RF power RFP3 to a bias electrode 201 disposed inside the plasma chamber 200 through a transmission line 702, e.g., a coaxial cable. The bias electrode 201 may be an electrostatic chuck (ESC).

A semiconductor device, e.g., a wafer 203, may be disposed on the bias electrode 201.

The first RF power RFP1 and the third RF power RFP3 may be the same signals to each other, or different signals from each other.

The third RF power generation circuit 500 includes a third RF power generator 510 and a third impedance matching circuit 520.

The third RF power generator 510 generates a third RF power RFP3 in response to a third pulse signal PS3. The third impedance matching circuit 520 is used to match impedance of the third RF power generator 510 with impedance of the plasma chamber 200. The pulse generator 600 may generate pulse signals PS1, PS2, and PS3 synchronized with each other.

The transmission line 701 transmits the first RF power RFP1 output from the first RF power generation circuit 300A and the second RF power RFP2 output from the second RF power generation circuit 400A to the RF output circuit 210. The transmission line 701 may be embodied in a coaxial cable, e.g., Y-cable.

A gas for generating plasma may be supplied to the plasma chamber 200 through a gas inlet Gas Inlet disposed on the side surface portion 205-2. According to an example embodiment, the second RF power RFP2 may be supplied to the bias electrode 201 instead of the RF output circuit 210.

FIG. 2 is a waveform diagram of signals used in the plasma processing device of FIG. 1. Referring to FIGS. 1 and 2, for convenience of description, it is assumed that the first pulse signal PS1 and the third pulse signal PS3 are the same signals each other; however, the first pulse signal PS1 and the third pulse signal PS3 may be different from each other as described above.

The first RF power RFP1 has a first frequency and a first duty ratio. The first duty ratio may be determined by a ratio PW1/PRI1 between a first pulse repetition interval PRI1 and a first pulse width PW1.

The second RF power RFP2 has a second frequency higher than the first frequency and a second duty ratio smaller than the first duty ratio. The second duty ratio may be determined by a ratio PW2/PRI2 between the second pulse repetition interval PRI2 and the second pulse width PW2.

In a pulse-on interval Pulse-on, that is, when each pulse signal PS1, PS2, or PS3 is at a first level, i.e., a high level, each RF power generator 310, 410, or 510 generates each RF power RFP1, RFP2, or RFP3.

In the pulse-off interval Pulse-off, that is, when each pulse signal PS1, PS2, or PS3 is at a second level, i.e., a low level, each RF power generator 310, 410, or 510 does not generate each RF power RFP1, RFP2, or RFP3. That is, an output time of the first RF power RFP1 and an output time of the second RF power RFP2 are equal to each other.

At the beginning of plasma-on interval Plasma-ON, plasma is generated by the second RF power RFP2, and thereafter plasma is generated by the first RF power RFP1. Accordingly, a delay in generation of plasma may be decreased or removed by the second RF power RFP2. As the second RF power RFP2 is supplied, a reflective power may be decreased and the plasma may be stably occurred.

Figure 3:
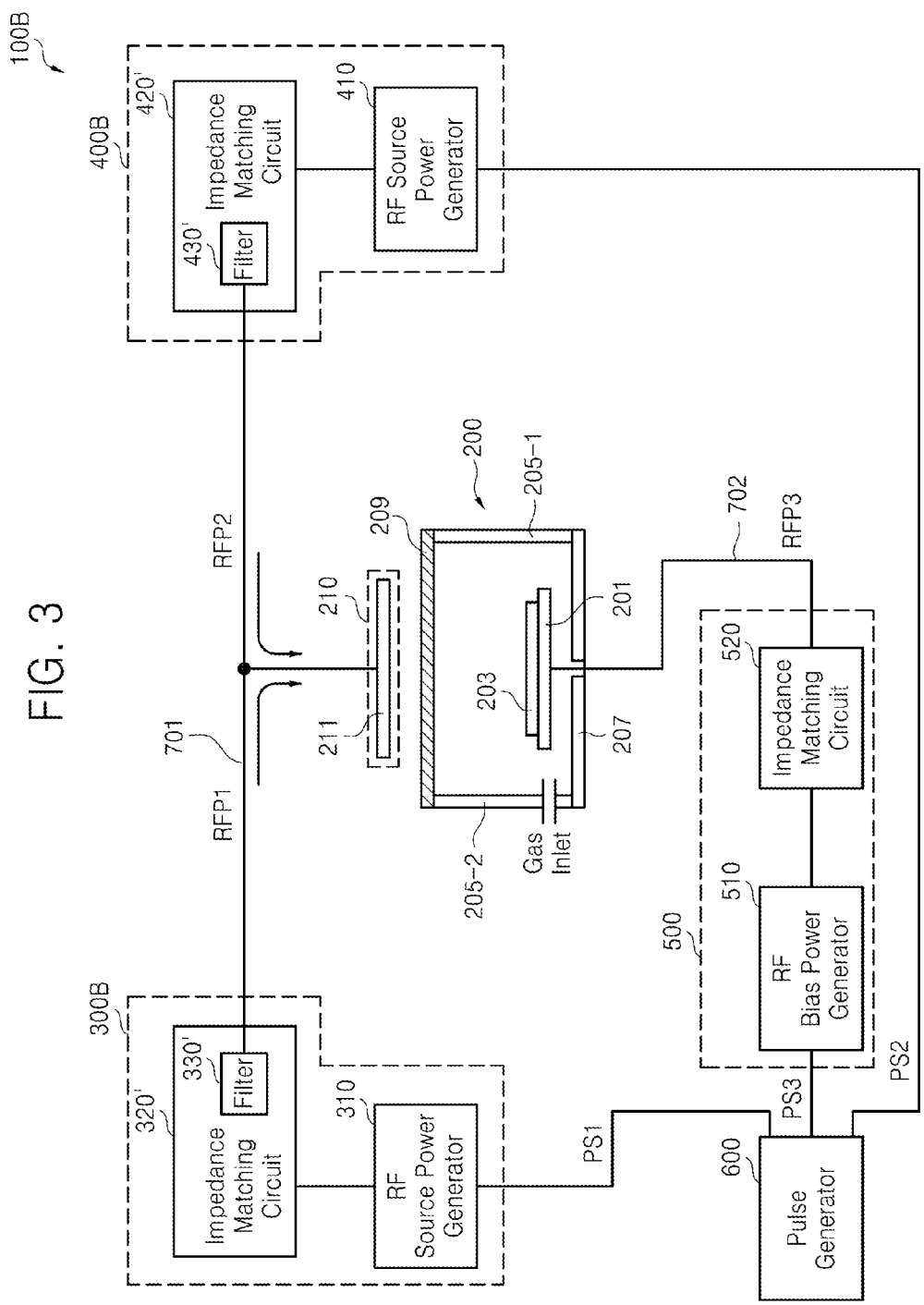
FIG. 3 is a block diagram of a plasma processing device according to another example embodiment of inventive concepts.

FIG. 3 is a block diagram of the plasma processing device according to another example embodiment of inventive concepts.

Referring to FIGS. 1 and 3, except that each filter 330' and 340' is embedded in each impedance matching circuit 320' and 420', a configuration and an operation of the plasma processing device 100A of FIG. 1 are the same as a configuration and an operation of the plasma processing device 100B of FIG. 2.

That is, the first RF power generation circuit 300B includes the first RF power generator 310 and the first impedance matching circuit 320' having the built-in first filter 330'. The second RF power generation circuit 400B includes the second RF power generator 410 and the second impedance matching circuit 420' having the built-in second filter 430'.

Figure 4:
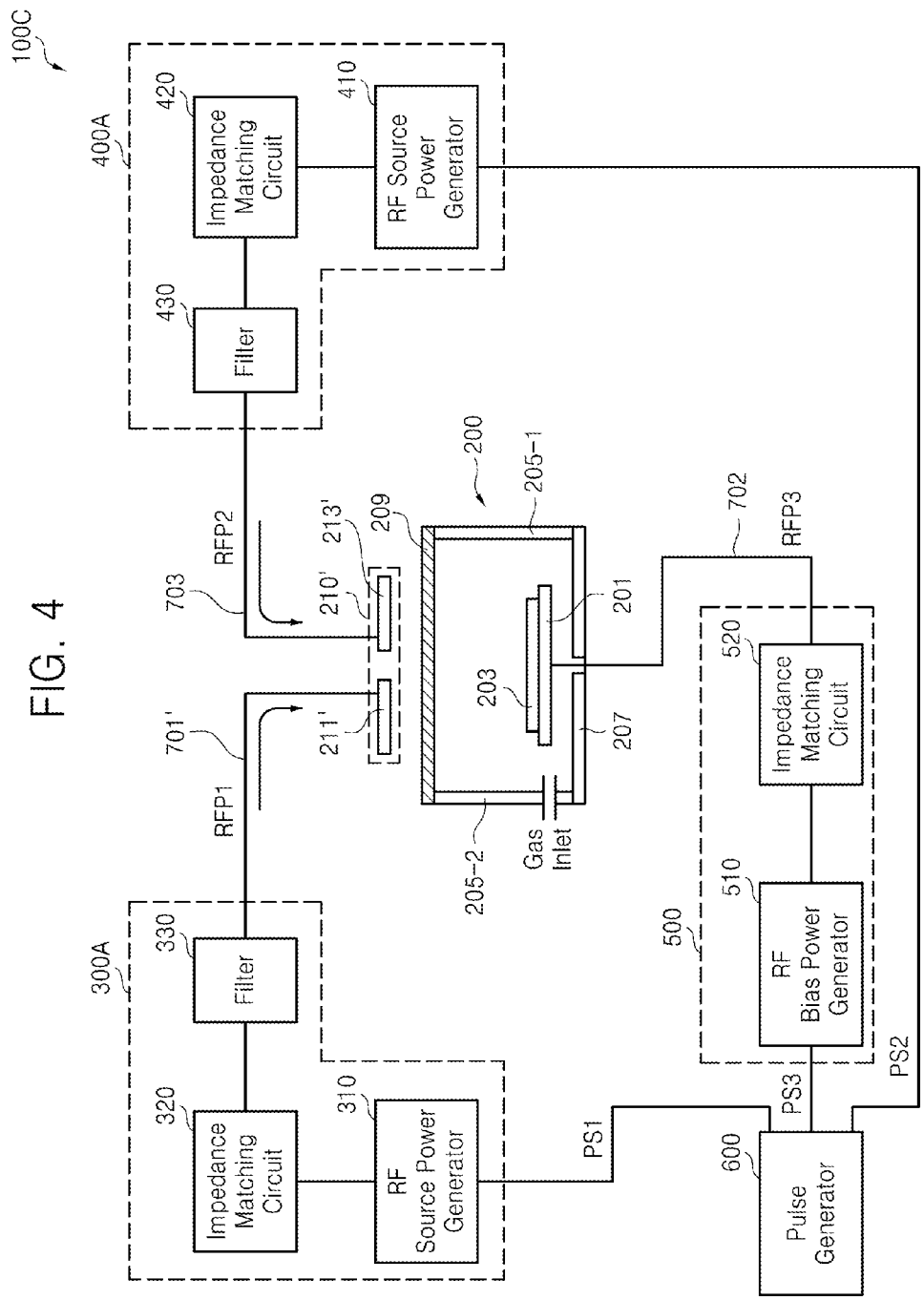
FIG. 4 is a block diagram of a plasma processing device according to still another example embodiment of inventive concepts.

FIG. 4 is a block diagram of the plasma processing device according to still another example embodiment of inventive concepts.

Referring to FIGS. 1 and 4, except that an RF output circuit 210' includes an antenna 211' and at least one electrode 213', and the first RF power RFP1 output from the first RF power generation circuit 300A is supplied to the antenna 211' through a first transmission line 701', and the second RF power RFP2 output from the second RF power generation circuit 400A is supplied to at least one electrode 213' through a second transmission line 703, a configuration and an operation of the plasma processing device 100A of FIG. 1 are equal to a configuration and an operation of a plasma processing device 100C of FIG. 4.

At least one electrode 213' is separated from the antenna 211'. Each of the first transmission line 701' and the second transmission line 703 may be a coaxial cable.

Figure 5:
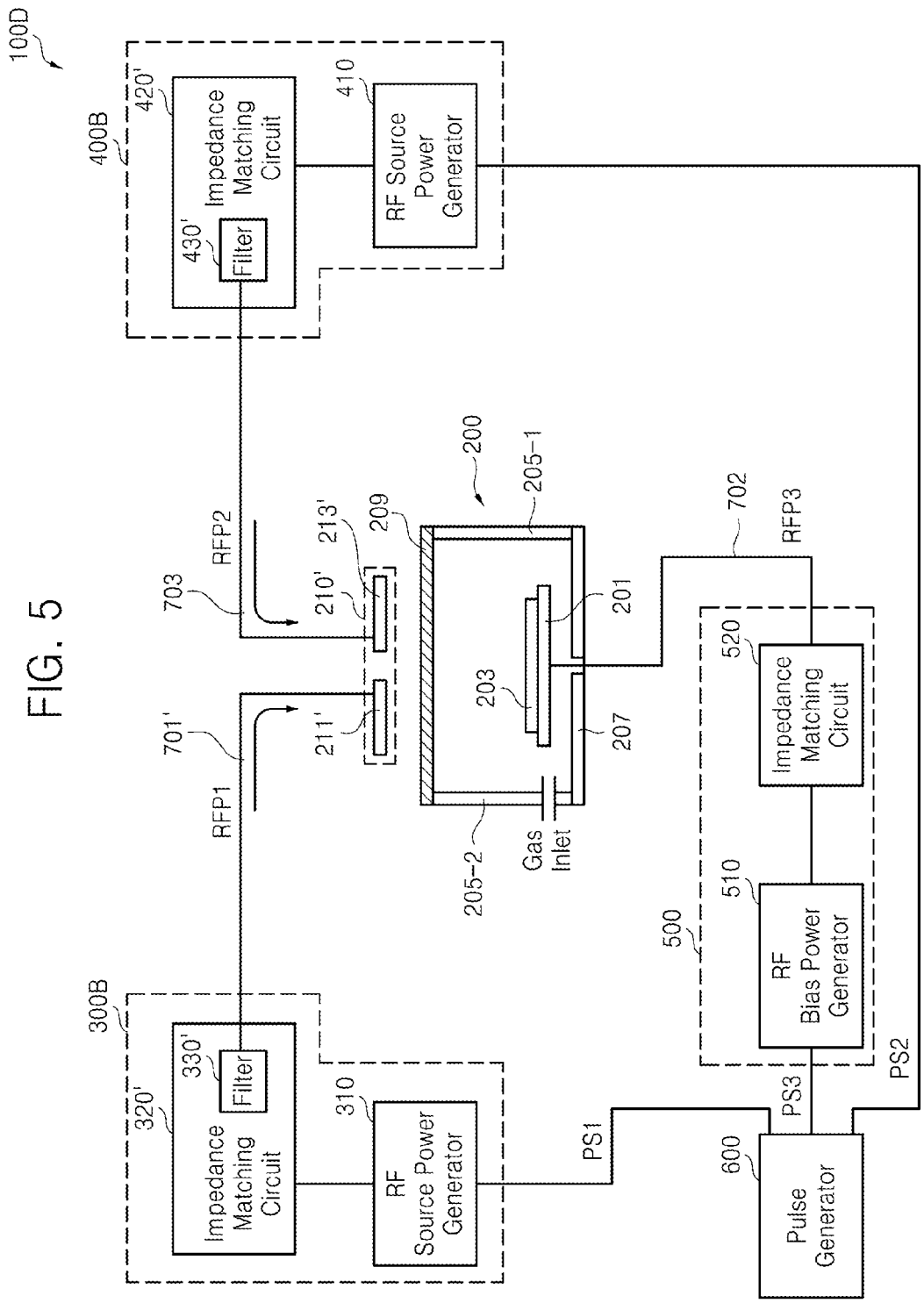
FIG. 5 is a block diagram of a plasma processing device according to still another example embodiment of inventive concepts.

FIG. 5 is a block diagram of the plasma processing device according to still another example embodiment of inventive concepts.

Referring to FIGS. 4 and 5, except that each filter 330' and 430' is built-in each impedance matching circuit 320' and 420', a configuration and an operation of the plasma processing device 100C of FIG. 4 are equal to a configuration and an operation of a plasma processing device 100D of FIG. 5.

Figure 6:
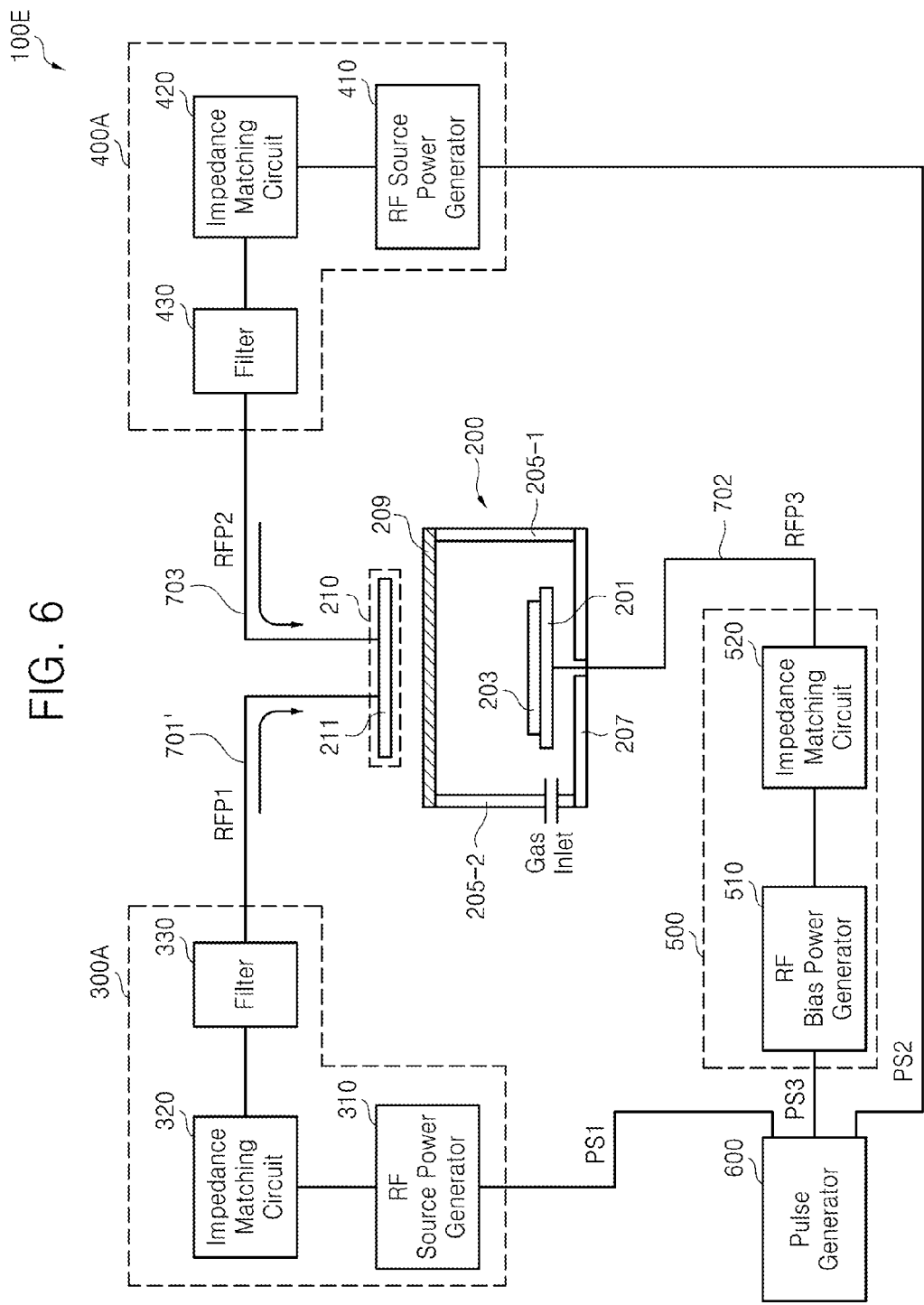
FIG. 6 is a block diagram of a plasma processing device according to still another example embodiment of inventive concepts.

FIG. 6 is a block diagram of a plasma processing device according to still another example embodiment of inventive concepts.

Referring to FIGS. 1 and 6, except that respective RF powers RFP1 and RFP2 are supplied to different portions of an identical antenna 211 through different transmission lines 701' and 703, a configuration and an operation of the plasma processing device 100A of FIG. 1 are equal to a configuration and an operation of a plasma processing device 100E of FIG. 6.

Figure 7:
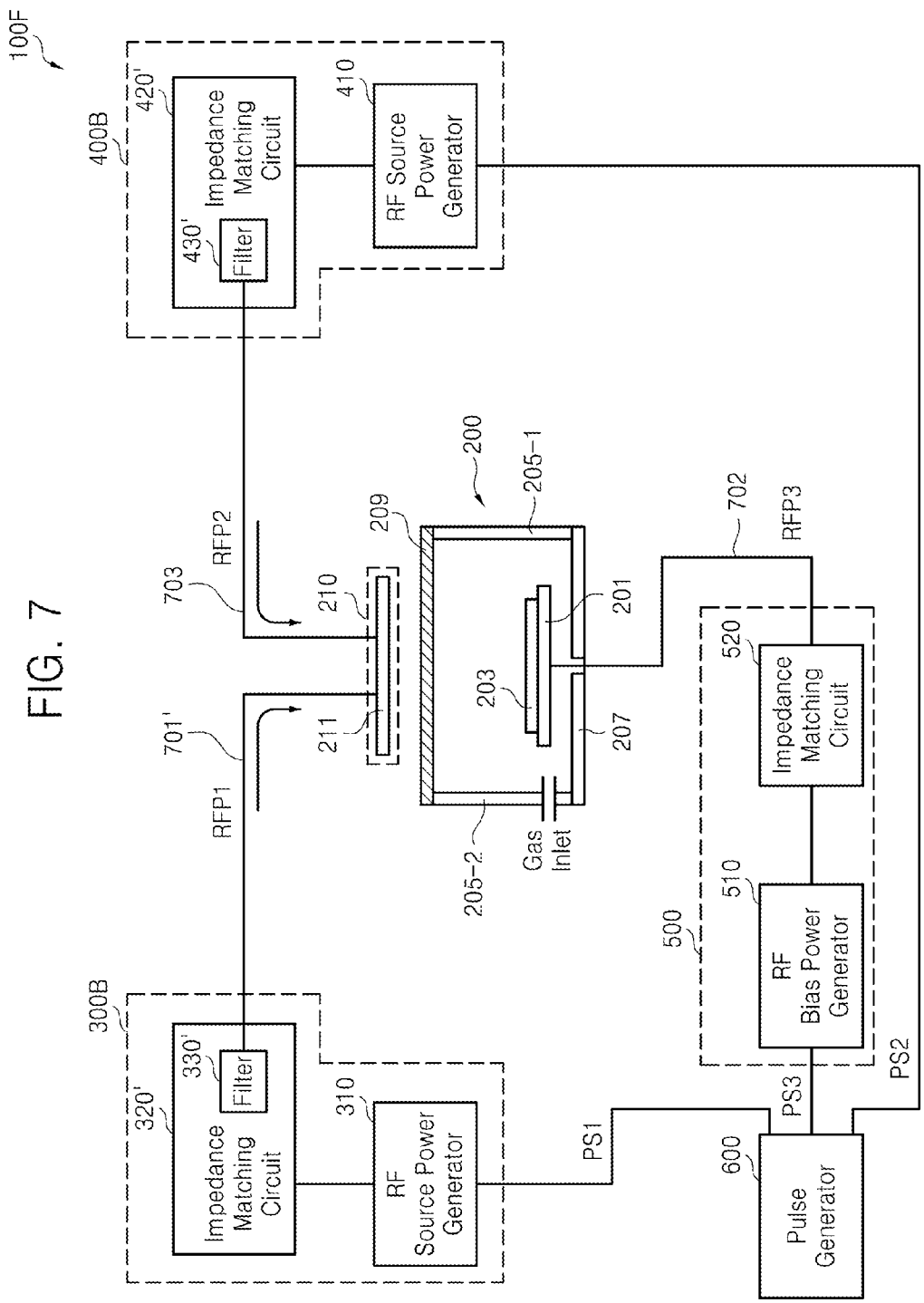
FIG. 7 is a block diagram of a plasma processing device according to still another example embodiment of inventive concepts.

FIG. 7 is a block diagram of the plasma processing device according to still another example embodiment of inventive concepts.

Referring to FIGS. 3 and 7, except that respective RF power RFP1 and RFP2 are supplied to different portions of the identical antenna 211, a configuration and an operation of the plasma processing device 100B of FIG. 3 are equal to a configuration and an operation of a plasma processing device 100F of FIG. 7.

Figure 8:
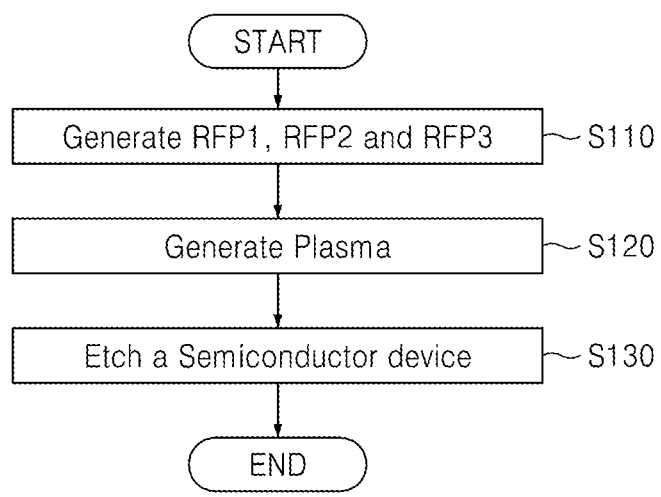
FIG. 8 is a flowchart for describing an operation of the plasma processing device according to an example embodiment of inventive concepts.

FIG. 8 is a flowchart for describing an operation of the plasma processing device according to an example embodiment of inventive concepts.

Referring to FIGS. 1 to 8, respective RF power generators 310, 410, and 510 of the plasma processing device 100A, 100B, 100C, 100D, 100E, or 100F (collectively referred to as 100) generate respective RF power RFP1, RFP2, and RFP3 in response to respective pulse signals P51, PS2, and PS3 (S110).

Based on an energy supplied to the RF output circuit 210, i.e., respective RF powers RFP1 and RFP2, and an energy supplied to the bias electrode 201, i.e., an RF power RFP3, an inductively coupled plasma is generated inside the plasma chamber 200 (S120). A specific material or a metal material of a semiconductor device, e.g., a wafer 203, on the bias electrode 201 is processed, e.g., etched, by the inductively coupled plasma (S130).

Figure 9:
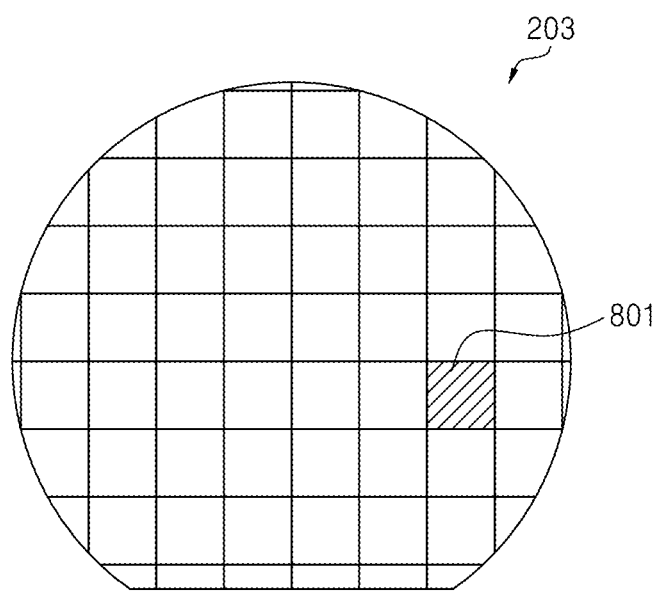
FIG. 9 is a wafer manufactured using the plasma processing device according to an example embodiment of inventive concepts.

FIG. 9 is a wafer manufactured using the plasma processing device according to an example embodiment of inventive concepts. A semiconductor device, e.g., the wafer 203, processed by the inductively coupled plasma includes a plurality of dies or a plurality of chips 801.

Figure 10:
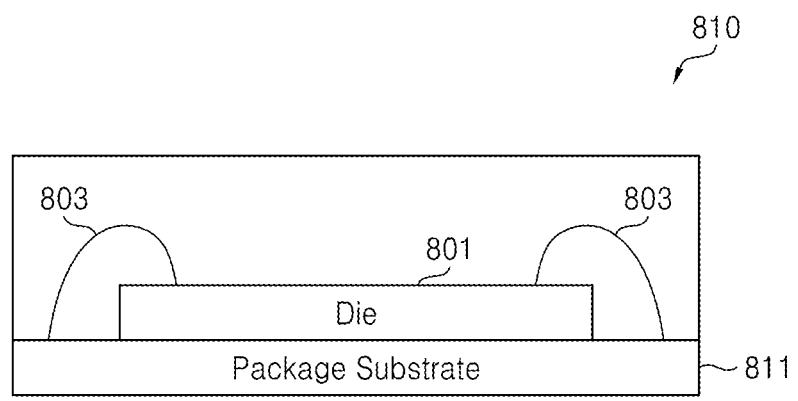
FIG. 10 is an example embodiment of a package including a die included in the wafer of FIG. 9.

FIG. 10 is an example embodiment of a package including a die included in the wafer of FIG. 9. A package 810 may include a die 801 mounted on a package substrate 811, and the die 801 may be electrically connected to the package substrate 811 through a plurality of bonding wires 803.

Figure 11:
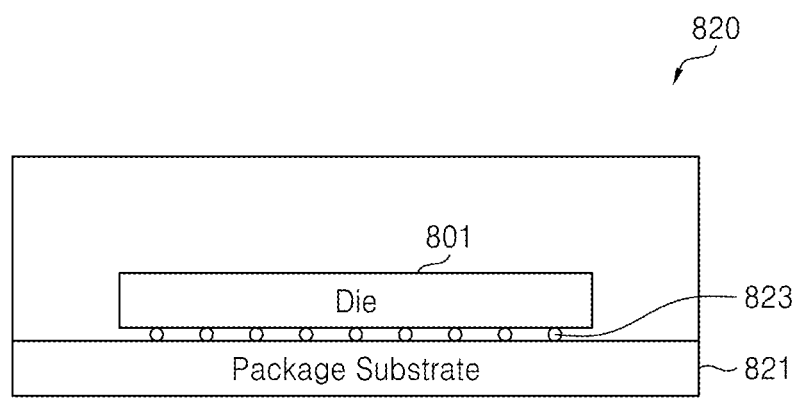
FIG. 11 is another example embodiment of the package including the die included in the wafer of FIG. 9.

FIG. 11 is another example embodiment of the package including a die included in the wafer of FIG. 9. A package 820 includes the die 801 mounted on the package substrate 821, and the die 801 may be electrically connected to the package substrate 821 through a plurality of bumps 823. For example, the die 801 may be embodied in a flip-chip.

Referring to FIGS. 10 and 11, each package 810 and 820 may be embodied in a Ball Grid Array (BGA), Chip Scale Package (CSP), Plastic Leaded Chip Carrier (PLCC), Plastic Dual In-Line Package (PDIP), Chip on Board (COB), CERamic Dual In-Line Package (CERDIP), plastic metric quad flat pack (MQFP), Thin Quad Flat Pack (TQFP), small-outline integrated circuit (SOIC), shrink small outline package (SSOP), thin small outline (TSOP), system in package (SIP), multi chip package (MCP), wafer-level package (WLP), or wafer-level processed stack package (WSP).

An RF power generation module may include the first RF power generation circuit 300A, the second RF power generation circuit 400A, the third RF power generation circuit 500, and the pulse generator 600.

A plasma processing method according to an example embodiment of the present inventive concepts may decrease or remove a delay in occurrence (or generation) of plasma by supplying an additional RF power, having a frequency higher than a frequency of an RF source power and a duty ratio smaller than a duty ratio of the RF source power, to an antenna or an electrode at the beginning of occurrence of plasma. Accordingly, the method may stably generate plasma.

Although a few embodiments of inventive concepts have been shown and described, it will be appreciated by those skilled in the art that changes may be made in these embodiments without departing from the principles and spirit of the general inventive concept, the scope of which is defined in the appended claims and their equivalents.

What is claimed is:

1. A method of operating a plasma processing device comprising:
   outputting a first RF power having a first frequency and a first duty ratio;
   outputting a second RF power having a second frequency higher than the first frequency and a second duty ratio smaller than the first duty ratio;
   outputting a third RF power to a bias electrode in a plasma chamber; and
   generating plasma in the plasma chamber based on the first RF power, the second RF power and an energy output from the bias electrode,
   wherein the outputting of the first RF power and the outputting of the second RF power are synchronized with each other.

2. The method of claim 1, wherein
   the outputting the first RF power includes,
      generating the first RF power; and
      outputting the first RF power using a first RF power pass filter, and
   the outputting the second RF power includes,
      enerating the second RF power; and
      outputting the second RF power using a second RF power pass filter.

3. The method of claim 1, wherein the plasma processing device generates inductively coupled plasma.

4. The method of claim 1, wherein the first duty ratio is based on a ratio between a first pulse repletion interval and a first pulse width and the second duty ratio is based on a ratio between a second pulse repletion interval and a second pulse width.

5. A method of operating a plasma processing device comprising:
   outputting a first RF power having a first frequency and a first duty ratio;
   outputting a second RF power having a second frequency higher than the first frequency and a second duty ratio smaller than the first duty ratio; and
   supplying each of the first RF power and the second RF power to an antenna outside and above a plasma chamber through different transmission lines,
   wherein the outputting of the first RF power and the outputting of the second RF power are synchronized with each other.

6. The method of claim 5, wherein the supplying each of the first RF power and the second RF power to the antenna includes transmitting each of the first RF power and the second RF power to the antenna outside and above the plasma chamber through the different transmission lines.

7. The method of claim 6, wherein the supplying each of the first RF power and the second RF power to the antenna includes,
   supplying the first RF power to the antenna through a first transmission line; and
   supplying the second RF power to the antenna through a second transmission line.

8. The method of claim 5, wherein
   the outputting the first RF power includes,
      generating the first RF power; and
      outputting the first RF power using a first RF power pass filter, and
   the outputting the second RF power includes,
      generating the second RF power; and
      outputting the second RF power using a second RF power pass filter.

9. The method of claim 5, wherein the first duty ratio is based on a ratio between a first pulse repletion interval and a first pulse width and the second duty ratio is based on a ratio between a second pulse repletion interval and a second pulse width.

10. A method of operating a plasma processing device comprising:
    outputting a first RF power having a first frequency and a first duty ratio;
    outputting a second RF power having a second frequency higher than the first frequency and a second duty ratio smaller than the first duty ratio;
    supplying the first RF power to an antenna outside and above a plasma chamber; and
    supplying the second RF power to at least one electrode outside and above the plasma chamber,
    wherein the outputting of the first RF power and the outputting of the second RF power are synchronized with each other.

11. The method of claim 10, wherein
    the outputting the first RF power includes,
       generating the first RF power; and
       outputting the first RF power using a first RF power pass filter, and
    the outputting the second RF power includes,
       generating the second RF power; and
       outputting the second RF power using a second RF power pass filter.

12. The method of claim 10, wherein the supplying the first RF power to the antenna includes transmitting the first RF power to the antenna, and the supplying the second RF power to the at least one electrode includes transmitting the second RF power to the at least one electrode.

13. The method of claim 10, wherein the first duty ratio is based on a ratio between a first pulse repletion interval and a first pulse width and the second duty ratio is based on a ratio between a second pulse repletion interval and a second pulse width.

14. A method of manufacturing a semiconductor device comprising:

outputting a first RF power having a first frequency and a first duty ratio to an RF output circuit;

outputting a second RF power having a second frequency higher than the first frequency and a second duty ratio smaller than the first duty ratio to the RF output circuit;

outputting a third RF power to a bias electrode inside the plasma chamber;

generating plasma inside the plasma chamber using an energy output from the RF output circuit and an energy output from the bias electrode; and processing a wafer on the bias electrode using an ion energy generated by the plasma, wherein the outputting of the first RF power and the outputting of the second RF power are synchronized with each other.

15. The method of claim 14, wherein the processing is etching.

16. The method of claim 14, wherein each of the first RF power and the second RF power is supplied to an RF antenna of the RF output circuit through at least one transmission line.

17. The method of claim 14, wherein the first RF power is supplied to an antenna of the RF output circuit through a first transmission line, and the second RF power is supplied to at least one electrode of the RF output circuit through a second transmission line.

18. The method of claim 14, wherein the output time of the first RF power and an output time of the third RF power are synchronized with each other.

* * * * *